United States Patent
Fujita (10) Patent No.: US 10,506,344 B2
(45) Date of Patent: Dec. 10, 2019

(54) AMPLIFYING DEVICE

(71) Applicant: YAMAHA CORPORATION, Hamamatsu-shi (JP)

(72) Inventor: Shinichi Fujita, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 16/217,542

(22) Filed: Dec. 12, 2018

(65) Prior Publication Data

US 2019/0191250 A1    Jun. 20, 2019

(30) Foreign Application Priority Data

Dec. 15, 2017 (JP) .................................. 2017-240633

(51) Int. Cl.
| | |
|---|---|
| *H04R 5/04* | (2006.01) |
| *H03F 3/181* | (2006.01) |
| *H03F 3/68* | (2006.01) |
| *H05K 1/02* | (2006.01) |
| *H04S 5/00* | (2006.01) |
| *H05K 1/14* | (2006.01) |

(52) U.S. Cl.
CPC ............... *H04R 5/04* (2013.01); *H03F 3/181* (2013.01); *H03F 3/68* (2013.01); *H04S 5/00* (2013.01); *H05K 1/0219* (2013.01); *H03F 2200/03* (2013.01); *H03F 2200/189* (2013.01); *H05K 1/142* (2013.01); *H05K 1/144* (2013.01); *H05K 2201/0715* (2013.01); *H05K 2201/09672* (2013.01)

(58) Field of Classification Search
None
See application file for complete search history.

(56) References Cited

U.S. PATENT DOCUMENTS

| | | | | |
|---|---|---|---|---|
| 5,740,527 A | * | 4/1998 | Mitama ................ | H04B 1/3827 361/818 |
| 8,976,540 B2 | * | 3/2015 | Yoo ...................... | H05K 9/0028 361/818 |
| 2007/0297158 A1 | * | 12/2007 | Lee ......................... | G06F 1/184 361/790 |

FOREIGN PATENT DOCUMENTS

GB        2295526 A        5/1996

OTHER PUBLICATIONS

Extended European Search Report issued in European Appln. No. 18212614.4 dated May 3, 2019.
(Continued)

*Primary Examiner* — James K Mooney
(74) *Attorney, Agent, or Firm* — Rossi, Kimms & McDowell LLP (57) ABSTRACT

An amplifying device includes first and second substrates. The first substrate has a first mounting surface, and the second substrate has a second mounting surface. The first mounting surface of the first substrate that is opposite the second substrate is provided with: a first ground line; a first signal line configured to transfer an audio signal; and a first amplifier configured to amplify the audio signal. The second mounting surface of the second substrate that is opposite the first substrate is provided with: a second grounded line; a second signal line configured to transfer an audio signal; and a second amplifier configured to amplify the audio signal. The first and second grounded lines correspond to each other in position and shape, and overlap in planar view. The first and second signal lines correspond to each other in position and shape, and overlap in planar view.

8 Claims, 9 Drawing Sheets

(56) References Cited

OTHER PUBLICATIONS

"Following in the Footsteps of Audio / Pioneer A-09", [online], [Dec. 8, 2017, searched]. Retrieved Oct. 5, 2018. URL: http://audio-heritage.jp/PIONEER-EXCLUSIVE/amp/a-09.html. English translation provided.

* cited by examiner

AMPLIFYING DEVICE

CROSS REFERENCE TO RELATED APPLICATIONS

This application claims priority from Japanese Patent Application 2017-240633, filed Dec. 15, 2017, the entire contents of which are incorporated herein by reference.

BACKGROUND OF THE INVENTION

Field of the Invention

The present invention relates to an amplifying device that amplifies audio signals and to the construction thereof.

Description of the Related Art

Conventionally, twin-monaural constructions have been proposed as amplifying devices that amplify audio signals for the left channel and the right channel. In one such twin-monaural construction, a substrate on which an amplifier for the right channel is disposed and a substrate on which an amplifier for the left channel is disposed, separately (e.g., Non-Patent Document 1: "Following in the Footsteps of Audio"/Pioneer A-09", [online], [Dec. 8, 2017, searched].

In an amplifying device having twin-monaural construction, a ground loop is formed by grounded lines for the left and the right channels, and signal lines. In the event that a magnetic field is generated near the ground loop formed by the grounded lines and the signal lines, the magnetic field produces a current in the grounded loop. This phenomenon may cause reduction of S/N (Signal to Noise) ratio for audio signals.

SUMMARY

Under the circumstances described above, it is an object of the present invention to reduce noise caused by a ground loop in an amplifying device employing a twin-monaural construction.

To achieve the above-described object, an amplifying device according to one aspect of the present invention includes a first substrate and a second substrate facing each other, and in which the first substrate has a first mounting surface, in which the first mounting surface of the first substrate that is on an opposite side of the second substrate is provided with: a first ground line; a first signal line configured to transfer a first audio signal; and a first amplifier configured to amplify the first audio signal, in which the second substrate has a second mounting surface, in which the second mounting surface of the second substrate that is on an opposite side of the first substrate is provided with: a second grounded line; a second signal line configured to transfer a second audio signal; and a second amplifier configured to amplify the second audio signal, in which the first grounded line and the second grounded line correspond to each other in their positions and shapes, and overlap with each other in planar view, and in which the first signal line and the second signal line correspond to each other in their positions and shapes, and overlap with each other in planar view.

DESCRIPTION OF THE EMBODIMENTS

First Embodiment

Figure 1:
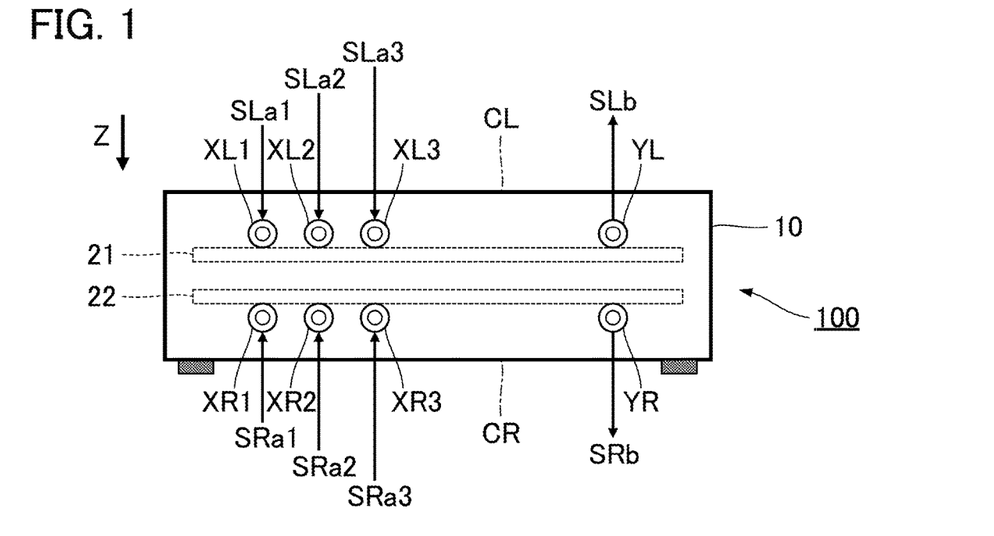
FIG. 1 is a rear view of an amplifying device according to a first embodiment.

FIG. 1 is a rear view of an amplifying device 100 according to a first embodiment. The amplifying device 100 according to the first embodiment is an audio processing device that performs various types of audio processing. Examples of the audio processing include amplifying audio signals for the left and the right channels. The amplifying device 100 includes a housing 10 having a substantially rectangular shape. As shown in FIG. 1, the rear side of the housing 10 is provided with terminals to be connected to one or more external devices (not shown). Specifically, the rear side of the housing 10 is provided with: input terminals XL1, XL2 and XL3 (hereinafter, also denoted as XL), and an output terminal YL that corresponds to the left channel; and input terminals XR1, XR2 and XR3 (hereinafter, also denoted as XR), and an output terminal YR that corresponds to the right channel. The input terminals XL and the input terminals XR are composed of same mounting components. The output terminal YL and the output terminal YR are composed of same mounting components.

Left channel audio signals SLa1, SLa2 and SLa3 are respectively supplied to the input terminals XL1, XL2 and XL3, from one or more external devices. Right channel audio signals SRa1, SRa2 and SRa3 are respectively supplied to the input terminals XR1, XR2 and XR3 from one or more external devices. The left channel audio signals SLa1, SLa2 and SLa3 are subjected to an audio processing. As a result, a left channel audio signal SLb is generated and is output from the output terminal YL. Similarly, the right channel audio signals SRa1, SRa2 and SRa3 are subjected to an audio processing. As a result, a right channel audio signal SRb is generated and is output from the output terminal YR. The left channel audio signal SLb output from the output terminal YL is supplied to a sound outputting device for the left channel (not shown). Similarly, the right channel audio signal SRb output from the output terminal YR is supplied to a sound outputting device for the right channel (not shown).

As shown in FIG. 1, the amplifying device 100 includes a first substrate 21 and a second substrate 22 in the housing 10. The first substrate 21 is provided with components corresponding to the left channel. The second substrate 22 is provided with components corresponding to the right channel. In other words, the amplifying device 100 has a twin-monaural construction. In the twin-monaural construction, the first substrate 21 corresponding to the left channel is a substrate other than the second substrate 22 corresponding to the right channel. In the description described below, suffix "L" is denoted next to respective reference numerals indicating elements for the left channel. Suffix "R" is denoted next to respective reference numerals indicating elements for the right channel.

Figure 2:
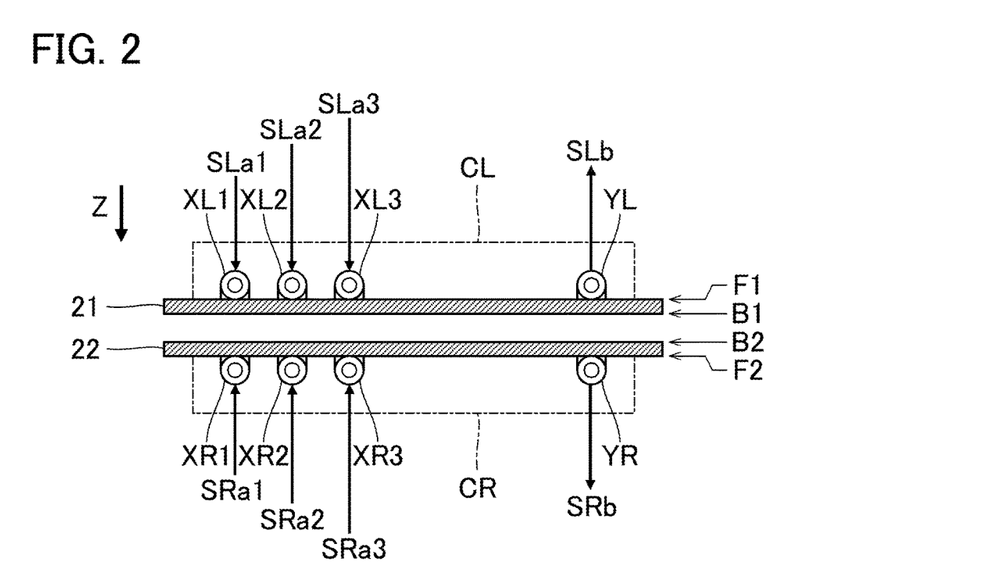
FIG. 2 is a side view of a first substrate and a second substrate.

Each of the first substrate 21 and the second substrate 22 is a rectangular insulating substrate on which interconnection lines are formed. FIG. 2 is a side view of the first substrate 21 and the second substrate 22 from the rear side of the housing 10. The first substrate 21 and the second substrate 22 have the same planar shape and the same size. As shown in FIG. 2, the first substrate 21 and the second substrate 22 are disposed inside the housing 10 so as to face each other with space therebetween. Specifically, the first substrate 21 and the second substrate 22 are substantially parallel. The entirety of the first substrate 21 and the entirety of the second substrate 22 overlap with each other in planar view. The first embodiment exemplifies a configuration of the amplifying device 100 in which the first substrate 21 is above the second substrate 22. In the description below, the direction perpendicular to the surfaces of the first substrate 21 and the second substrate 22 will be denoted as the Z direction. The second substrate 22 is on the positive side of the Z direction as seen from the first substrate 21.

The first substrate 21 is a flat circuit board including a mounting surface F1 (an example of "first mounting surface") and an opposite surface B1. The second substrate 22 is a flat circuit board including a mounting surface F2 (an example of "second mounting surface") and an opposite surface B2. The mounting surface F1 is one of two surfaces of the first substrate 21, and is opposite (in the negative Z direction) of the second substrate 22. The opposite surface B1 is the other surface of the first substrate 21, and faces the second substrate 22, specifically the opposite surface B2. Similarly, the mounting surface F2 is one of two surfaces of the second substrate 22, and is opposite (in the positive Z direction) of the first substrate 21. The opposite surface B2 is the other surface of the second substrate 22, and faces the first substrate 21, specifically the opposite surface B1.

Figure 3:
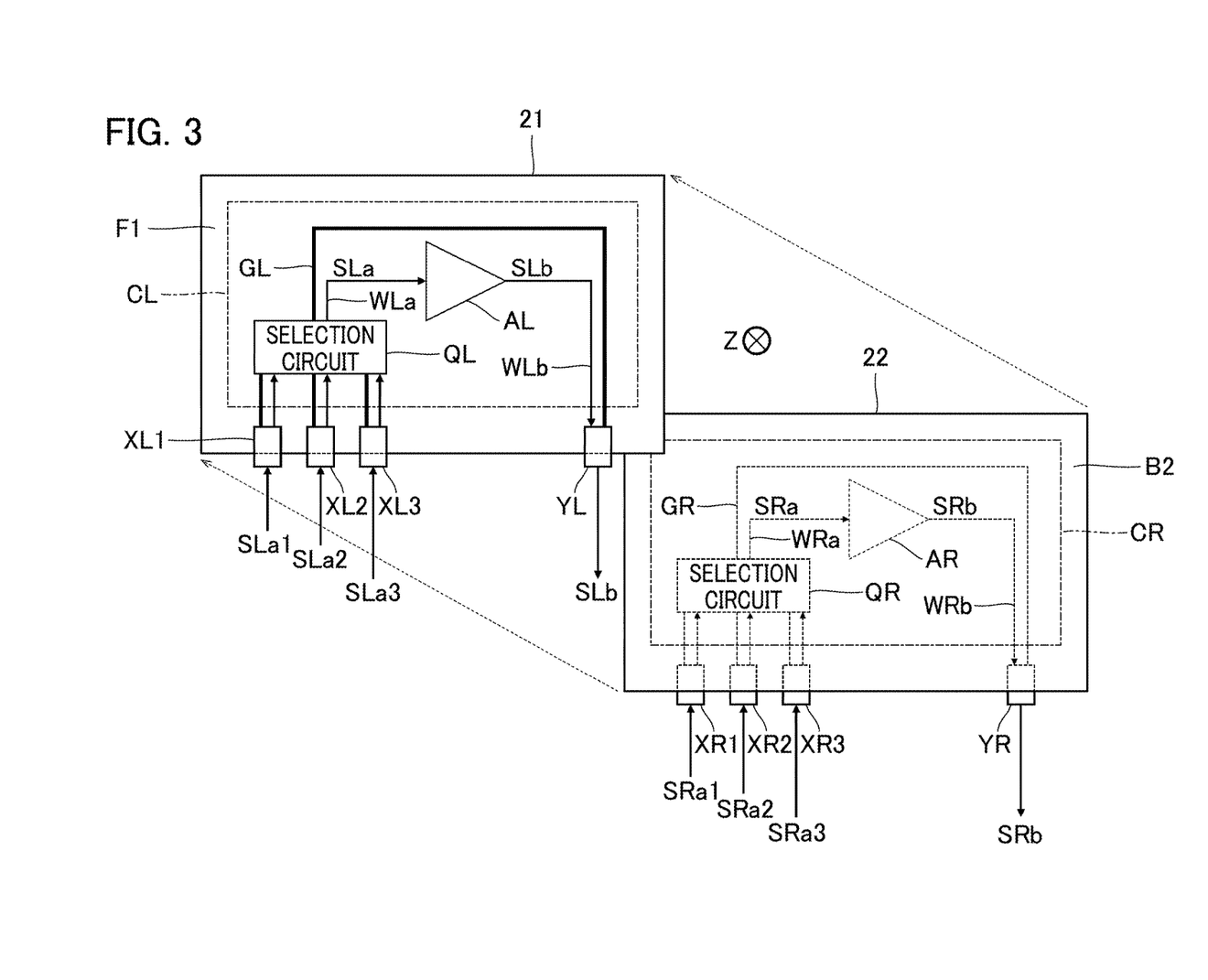
FIG. 3 is a plan view showing components on the first substrate and those on the second substrate.

FIG. 3 is a plan view of the first substrate 21 and the second substrate 22, which are offset relative to each other for purpose of description. In FIG. 3, the depth direction of the housing 10 corresponds to the positive Z axis direction. As shown in FIG. 3, the mounting surface F1 of the first substrate 21 is provided with a grounded line GL, signal lines WLa and WLb (hereinafter, also denoted as "WL"), and a signal processing circuit CL. The signal processing circuit CL processes the left channel audio signals Sla, and includes mounting components (e.g., IC chips, resistors, and capacitors) on the mounting surface F1. In the first embodiment, the signal processing circuit CL includes an amplifier AL (an example of "first amplifier") and a selection circuit QL.

The selection circuit QL selects any one of the left channel audio signals XLa1, XLa2 and XLa3, which are supplied to the input terminals XL1 XL2 and XL3, respectively. The selected left channel audio signal from among the left channel audio signals XLa1, XLa2 and XLa3 will be denoted as "SLa". The left channel audio signal SLa selected by the selection circuit QL is supplied to the amplifier AL with the signal line WLa.

The amplifier AL amplifies the selected left channel audio signals Sla, to generate the left channel audio signal SLb.

The left channel audio signal SLb amplified by the amplifier AL is supplied to the output terminal YL with the signal line WLb. As will be understood from the foregoing description, the signal lines WLa and WLb function as signal lines (examples of "first signal lines") for transferring left channel audio signals including the left channel audio signals SLa and SLb. The grounded line GL (an example of "first grounded line") is set to the grounded voltage which has the reference potential used in the signal processing circuit CL.

The mounting surface F2 of the second substrate 22 is provided with a grounded line GR, signal lines WRa and WRb (hereinafter, also denoted as "WR"), and a signal processing circuit CR. In other words, the first substrate 21 and the second substrate 22 are provided with the same components. As shown by broken lines in FIG. 3, when the second substrate 22 is viewed from the positive Z direction (the opposite surface B2 side), the grounded line GR, the signal lines WR and the signal processing circuit CR are on the surface on the far side of the drawing.

The signal processing circuit CR processes the right channel audio signals SRa, and includes a number of mounting components (e.g., IC chips, resistors, and capacitor) on the mounting surface F2. In the first embodiment, the signal processing circuit CR includes an amplifier AR (an example of "second amplifier") and a selection circuit QR.

The selection circuit QR selects any one of the right channel audio signals XRa1, XRa2 and XRa3, which are supplied to the input terminals XR1 XR2 and XR3, respectively. The selected right channel audio signal from among the right channel audio signals XRa1, XRa2 and XRa3 will be denoted as "SRa". The right channel audio signal SRa selected by the selection circuit QR is supplied to the amplifier AR with the signal line WRa. The amplifier AR amplifies the selected right channel audio signals SRa, to generate the right channel audio signal SRb. The right channel audio signal SRb amplified by the amplifier AR is supplied to the output terminal YR with the signal line WRb. As will be understood from the foregoing description, the signal lines WRa and WRb function as signal lines (examples of "second signal lines") for transferring right channel audio signals. The right channel audio signal includes the selected SRa and the right channel audio signal SRb amplified by the amplifier AR. The grounded line GR (an example of "second grounded line") is set to the grounded voltage which has the reference potential used in the signal processing circuit CR.

As will be understood from FIGS. 2 and 3, the first substrate 21 is provided with components, and the second substrate 22 is provided with the same components as those on the first substrate 21. Each component on the first substrate 21 and a corresponding one on the second substrate 22 correspond to each other in their positions and shapes, and overlap with each other as seen from the Z direction. In the following, description will be given of correspondence relationships between the components on the first substrate 21 and those on the second substrate 22.

As will be understood from FIG. 3, the grounded line GL on the first substrate 21 and the grounded line GR on the second substrate 22 correspond to each other in their positions and shapes. Specifically, Specifically, when the first substrate 21 is viewed from the positive Z direction (the mounting surface F1 side or the opposite surface B2 side), the shape of the grounded line GL is the same as that of the grounded line GR.

Accordingly, the grounded line GL overlaps with the grounded line GR in the planar view in the state in which the first substrate 21 and the second first substrate 22 face each other. Here, "in planar view" means "as seen from along the Z direction". Similarly, the signal lines WL on the first substrate 21 and the signal lines WR on the second substrate 22 correspond to each other in their positions and shapes. Specifically, when the first substrate 21 is viewed from the positive Z direction, the shapes of the signal lines WL are the same as those of the signal lines WR.

Accordingly, the signal lines WL overlap with the signal lines WR in the planar view in the state in which the first substrate 21 and the second first substrate 22 face each other.

As will be understood from FIG. 3, the signal processing circuit CL overlaps with the signal processing circuit CR in the planar view in the state in which the first substrate 21 and the second substrate 22 face each other. For example, the selection circuit QL overlaps with the selection circuit QR in the planar view. The amplifier AL overlaps with the amplifier AR in the planar view. Specifically, when the second substrate 22 is viewed from of the positive Z direction, the position of each mounting component of the components of the signal processing circuit CL is the same as that of the corresponding signal processing circuit CR. In other words, the signal processing circuit CL and the signal processing circuit CR are composed of the same mounting components in the light of function. Among two mounting components that have a same function, one mounting component in the signal processing circuit CL and the other one in the signal processing circuit CR overlap with each other in the planar view.

As will be understood from FIGS. 2 and 3, the input terminals XL1, XL2 and XL3 for the left channel correspond to the input terminals XR1, XR2 and XR3 for the right channel, respectively. Each input terminal (an example of "first input terminal") from among the input terminals XL and a corresponding input terminal (an example of "second input terminal") from among the input terminals XR correspond to each other in their positions, and overlap with each other in the planar view. Specifically, the input terminals XL1 and the input terminals XR1 overlap with each other in the planar view. The input terminals XL2 and the input terminals XR2 overlap with each other in the planar view. The input terminals XL3 and the input terminals XR3 overlap with each other in the planar view. Similarly, the output terminal YL (an example of "first output terminal") and the output terminal YR (an example of "second output terminal") correspond to each other in their positions, and overlap with each other in the planar view.

Figure 4:
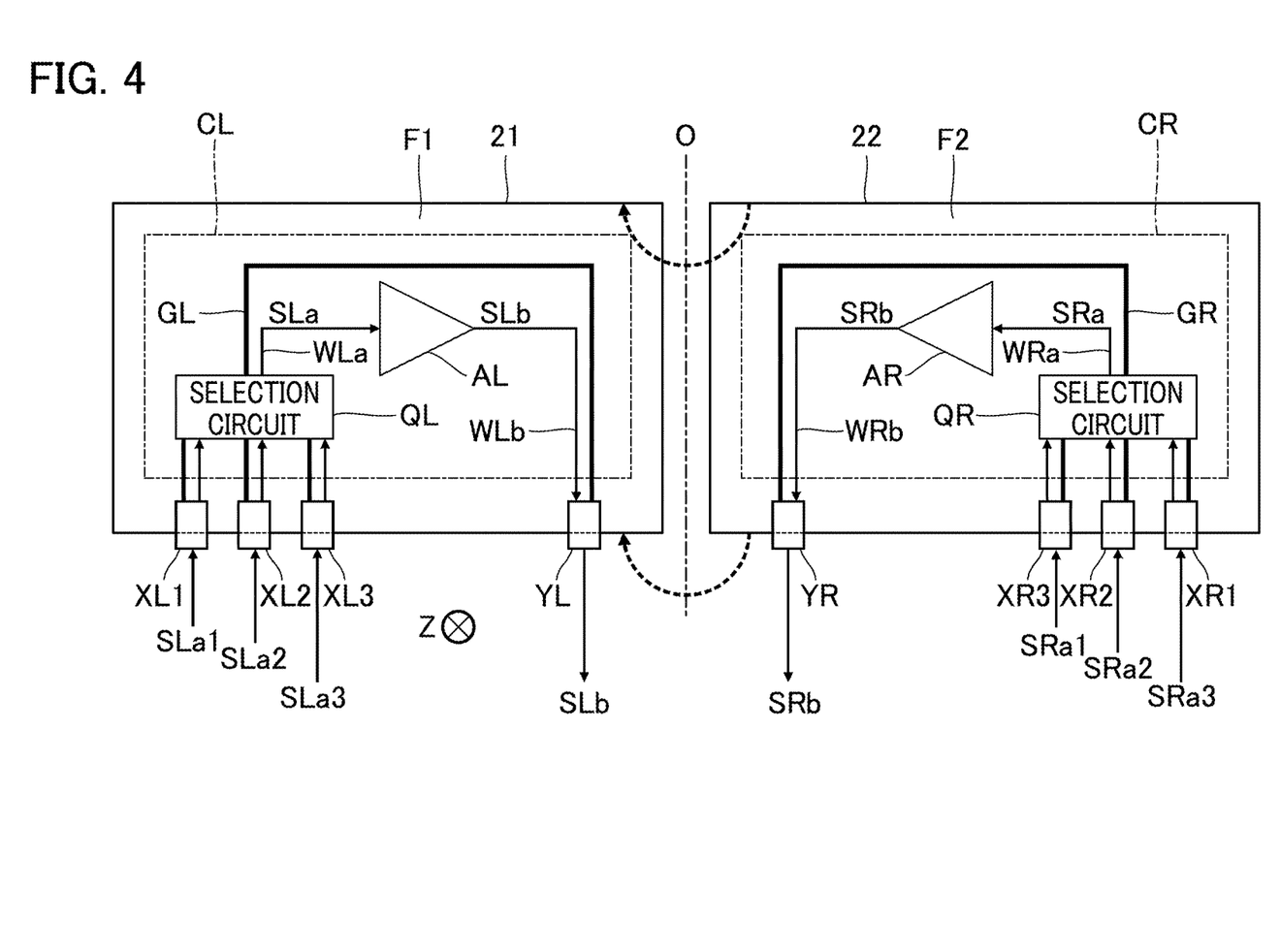
FIG. 4 is a plan view in a case in which the first substrate and the second substrate are on the same plane.

FIG. 4 is a plan view in a case in which the second substrate 22 shown in FIG. 3 is turned over, and in turn, the first substrate 21 and the second substrate 22 are disposed approximately symmetrically to the reference line O. The reference line O is along one side (referred to as "the first side") of the first substrate 21, and is also along one side (referred to as "the second side") of the second substrate 22 corresponding to that of the first substrate 21. The reference line O is between the first side and the second side, and is in parallel to both of the sides. What is depicted in FIG. 4 is also described as follows. The first substrate 21 and the second substrate F2 are disposed such that both of the mounting surface F1 and the mounting surface F2 face the negative side of the Z axis.

As shown in FIG. 4, an axial-symmetric relationship is satisfied between components on the mounting surface F1 of the first substrate 21 and those on the mounting surface F2 of the second substrate 22. In other words, components on the first mounting surface F1 are symmetric to those on the second mounting surface F2 with respect to an imaginary plane between (and parallel to) the first substrate 21 and the second substrate 22 facing each other. Specifically, the grounded line GL and the grounded line GR are axially symmetric relative to the reference line O. The signal lines WL and the signal lines WR are axially symmetric relative to the reference line O. The signal processing circuit CL and the signal processing circuit CR are also axially symmetric relative to the reference line O. The input terminal XL1 and the input XL2 are axially symmetric relative to the reference line O. Similarly, the input terminal XL2 and the input XR2 are axially symmetric relative to the reference line O. The input terminal XL3 and the input XR3 are axially symmetric relative to the reference line O. The output terminal YL and the output YR are axially symmetric relative to the reference line O. If the second substrate 22 shown in FIG. 4 is turned over and in turn the first substrate 21 and second substrate 22 are disposed such that the opposite surface B1 of the first substrate 21 faces the opposite surface B2 of the second substrate 22, the first substrate 21 and second substrate 22, illustrated in FIG. 4 is reverted to the original, as shown in FIG. 3.

As described above, in the first embodiment, the mounting surface F1 of the first substrate 21 that is on the opposite side of the second substrate 22 is provided with the grounded line GL, the signal lines WL and the signal processing circuit CL. The mounting surface F2 of the second substrate 22 that is on the opposite side of the first substrate 21 is provided with the grounded line GR, the signal lines WR and the signal processing circuit CR. The grounded line GL and the grounded line GR overlap with each other in the planar view. The signal lines WL and the signal lines WR overlap with each other in the planar view. The first embodiment provides an advantage that noise caused by a ground loop is reduced effectively as follows.

Figure 5:
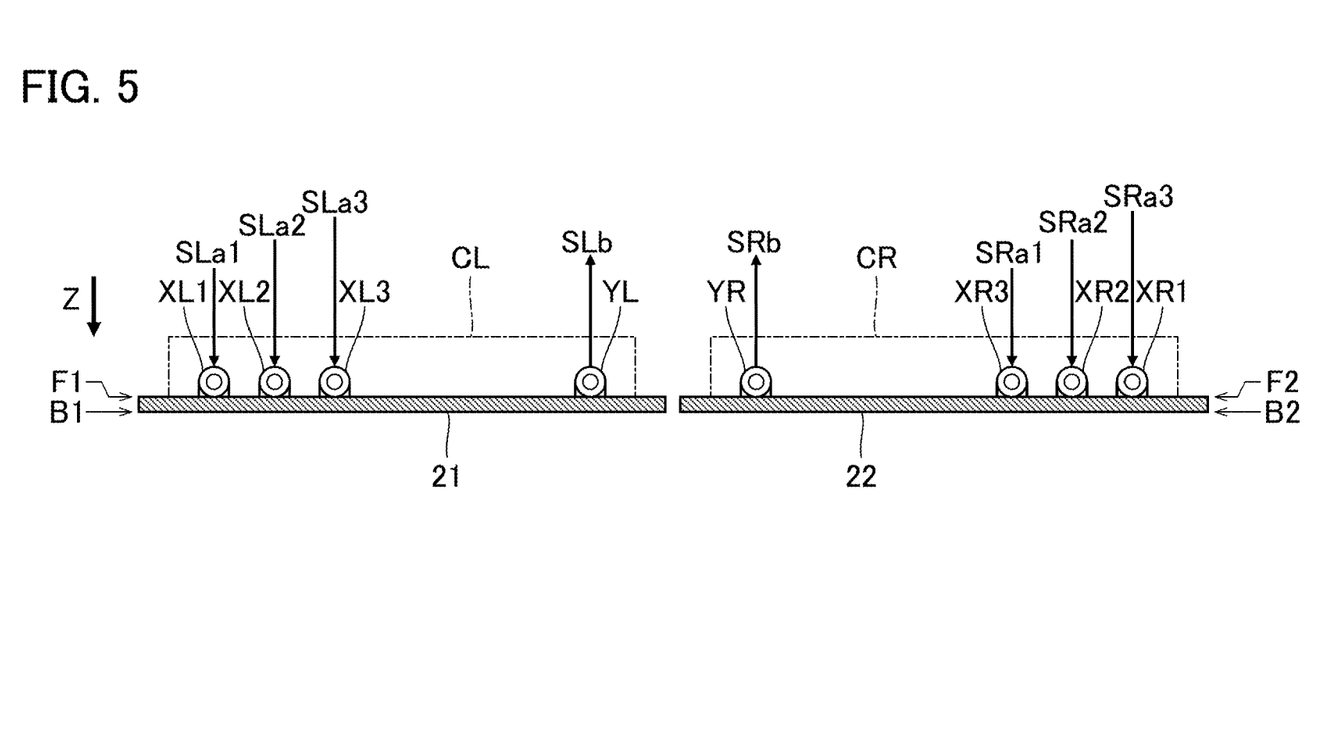
FIG. 5 is a side view of a first substrate and a second substrate according to Comparative Example 1.
Figure 6:
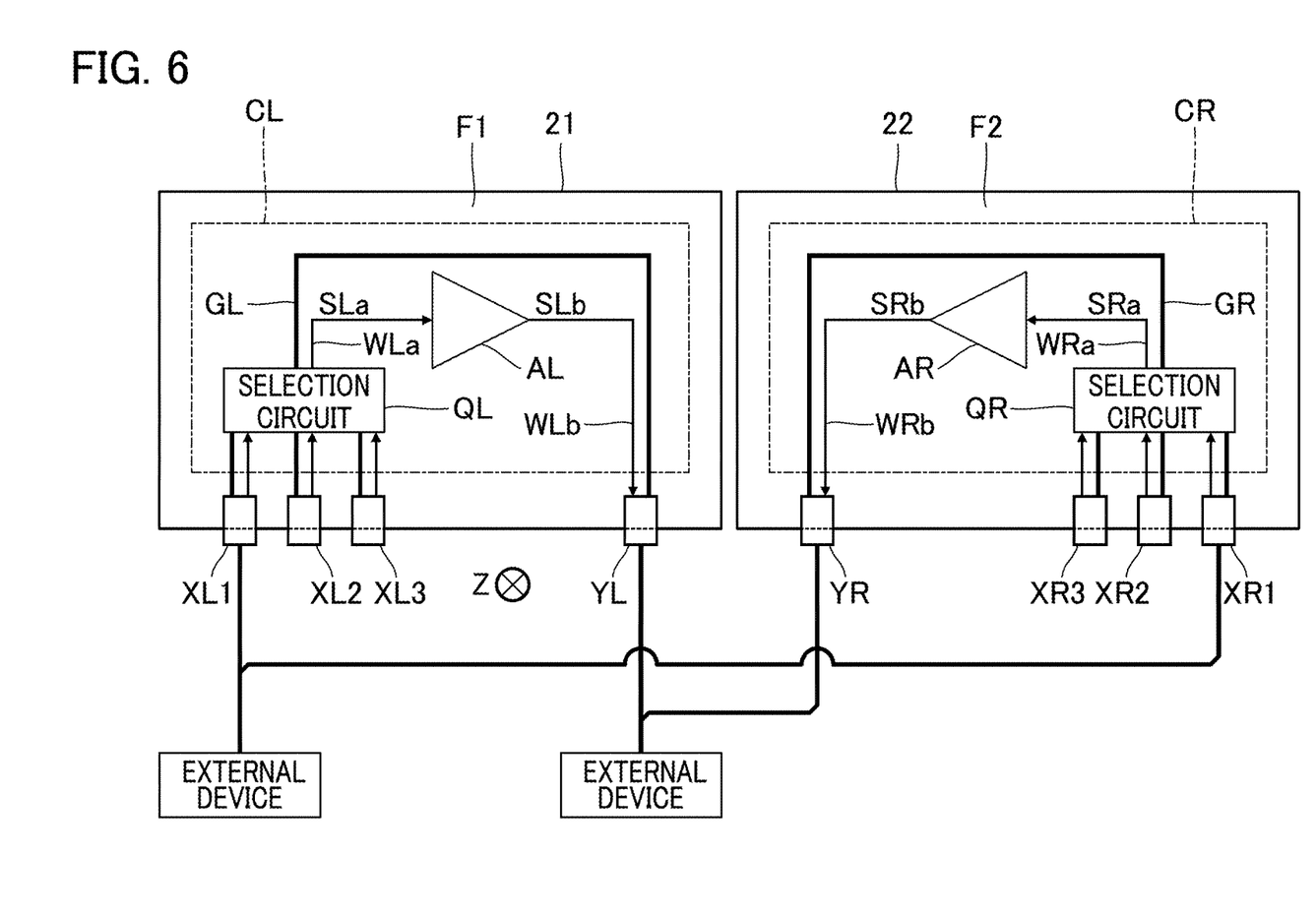
FIG. 6 is a plan view of the first substrate and the second substrate according to the Comparative Example 1.

FIGS. 5 and 6 show an explanatory drawing of a case in which the first substrate 21 and the second substrate 22 are disposed in the same plane (hereinafter, "Comparative Example 1"). In the Comparative Example 1, components on the first substrate 21 and those on the second substrate 22 are disposed symmetrically to the center line (not shown) between the first substrate 21 and the second substrate 22.

As will be understood from FIG. 6, in the Comparative Example 1, a ground loop is formed by lines including the grounded line GL and the grounded line GR. In the event that a magnetic field is generated near the above-described ground loop, the magnetic field produces a current in the grounded loop. This phenomenon may cause reduction of SN ratio for audio signals. The construction of the Comparative Example 1 gives rise to a relatively large area surrounded by the ground loop because the first substrate 21 and the second substrate 22 are on the same plane. Hereinafter, an area surrounded by the ground loop as viewed from the side will be referred to as "area in ground loop". A relatively large area in the ground loop leads to noise. This is a notable problem.

Figure 7:
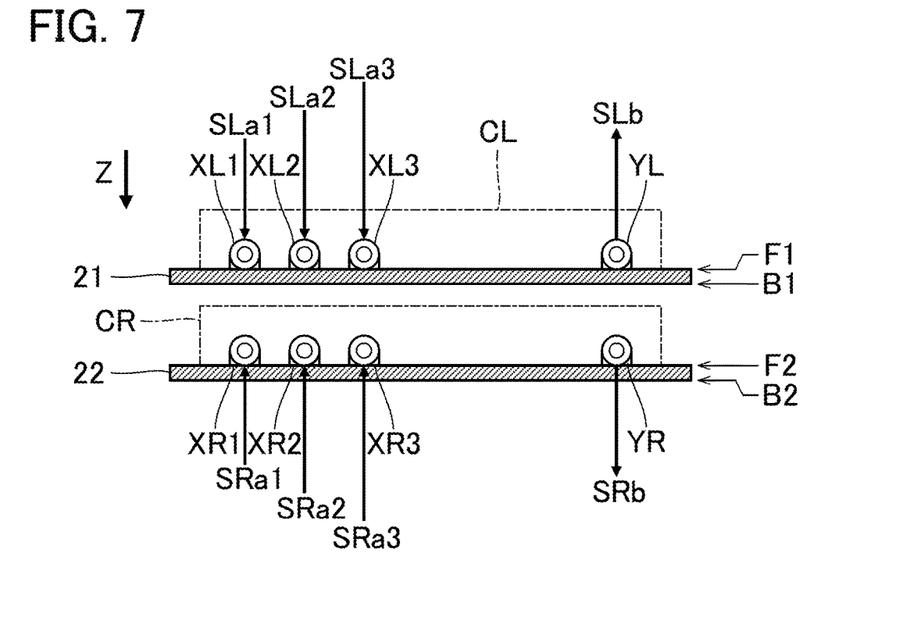
FIG. 7 is a side view of a first substrate and a second substrate according to Comparative Example 2.
Figure 8:
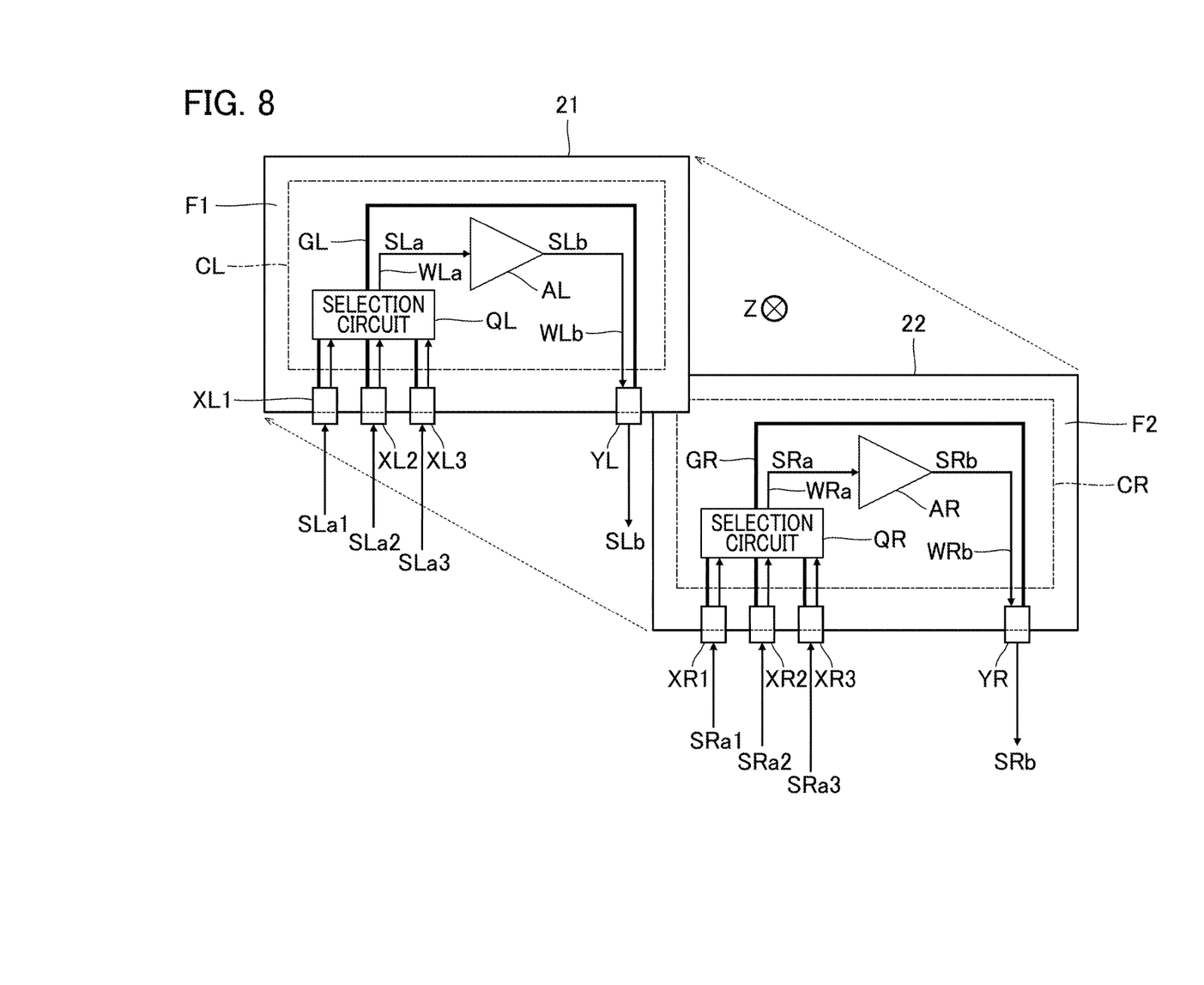
FIG. 8 is a plan view of the first substrate and the second substrate according to the Comparative Example 2.

FIGS. 7 and 8 show an explanatory drawing of a case in which the first substrate 21 and the second substrate 22 are in parallel (hereinafter, "Comparative Example 2"). The first substrate 21 and the second substrate 22 face each other with space therebetween such that the mounting surface F2 of the second substrate 22 faces the opposite surface B2 of the first substrate 21. In the Comparative Example 2, the first substrate 21 and the second substrate 22 overlap. Such a configuration enables reduction of the area in the ground loop including the grounded line GL and the grounded line GR as compared with that in the Comparative Example 1. Accordingly, noise caused by the ground loop is reduced as compared with that for the Comparative Example 1.

However, in the Comparative Example 2, the mounting surface F2 of the second substrate 22 that is on the opposite side of the first substrate 21 is provided with components (e.g., the signal processing circuit CR, the input terminals XR, and the output terminal YR) for the right channel. Such a configuration requires space between the first substrate 21 and the second substrate 22 such that the distance therebetween exceeds the maximum of the height among the components for the right channel. Accordingly, the reduction of the area in the ground loop has limitations, which also means that the reduction of noise has limitations.

In contrast, in the first embodiment, the first substrate 21 and the second substrate 22 face each other. Such a configuration enables the reduction of the area in the ground loop as compared with that in the Comparative Example 1. Accordingly, there is an advantage that less noise caused by the ground loop is achieved as compared with that in the Comparative Example 1. Furthermore, in the first embodiment, the mounting surface F1 of the first substrate 21 that is on the opposite side of the second substrate 22 is provided with components for the left channel. The mounting surface F2 of the second substrate 22 that is on the opposite side of the first substrate 21 is provided with components for the right channel. Such a configuration requires no space for components for the right channel between the first substrate 21 and the second substrate 22.

This enables the first substrate 21 and the second substrate 22 to be sufficiently close to each other. As mentioned above, the area in the ground loop (in other words, the area surrounded by the ground loop as viewed from the side) is reduced as compared with that in the Comparative Example 2. Accordingly, the first embodiment has another advantage in that less noise caused by the ground loop is achieved sufficiently as compared with that in the Comparative Example 2. The first embodiment provides the effect of reducing not only the area in the ground loop within a plane parallel to the substrates but also the area in the ground loop (in other words, the area surrounded by the ground loop as viewed from the side) depending on the distance between the two substrates overlapping with each other in the planar view.

In the first embodiment, input terminals XL1, XL2 and XL3 overlap with input terminals XR1, XR2 and XR3, respectively, in the planar view. The output terminal YL overlaps with the output terminal YR in the planar view. The above-described effect, that is, enabling the reduction of the area in the ground loop, is especially notable. In particular, in the first substrate 21 and the second substrate 22 according to the first embodiment, the axial-symmetric relationship is satisfied between one component on the mounting surface F1 and the corresponding component on the mounting surface F2. Such a configuration enables effective reduction of the area in the ground loop as compared with a case in which an asymmetric relationship is satisfied between the components on the two substrates. The above-described effect, that is, enabling the reduction of noise caused by the ground loop, is especially notable.

Second Embodiment

The second embodiment will now be described. In the embodiments shown in the following, elements having the same actions and functions as in the first embodiment are denoted by the same respective reference numerals as used for like elements in the description of the first embodiment, and detailed description thereof is omitted where appropriate.

Figure 9:
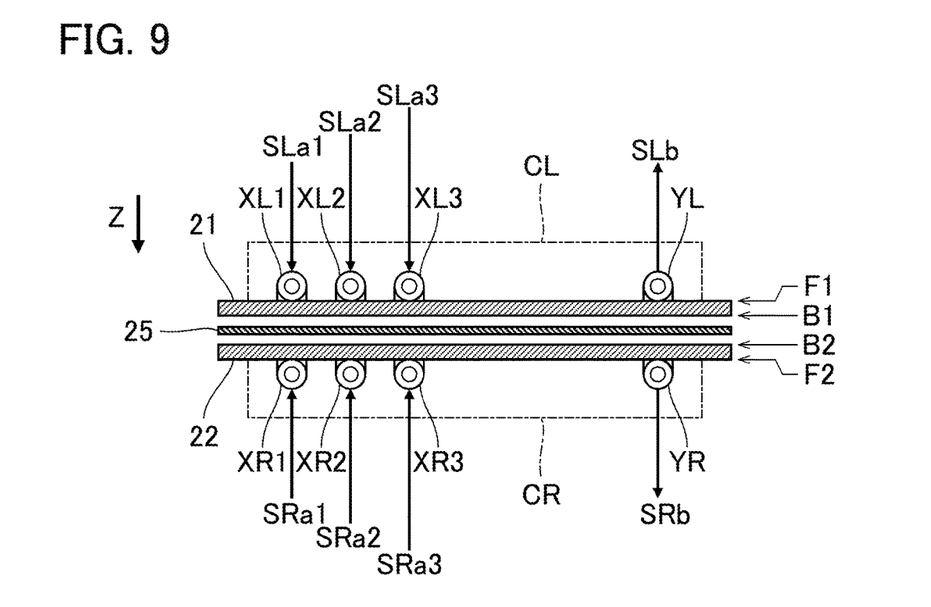
FIG. 9 is a plan view of a first substrate and a second substrate according to a second embodiment.

FIG. 9 is a side view of the first substrate 21 and the second substrate 22 in the amplifying device 100. As shown in FIG. 9, the amplifying device 100 according to the second embodiment includes a shielding 25 in addition to components according to the first embodiment. The shielding 25 is a flat-shaped conductive member made of conductive material. Examples of the conductive material include copper (Cu), aluminum (Al) and the like. Alternatively, the shielding 25 may be a sheet of conductive mesh, a sheet of shielding film or a sheet of composite material including the conductive material. Examples of the conductive mesh include metal mesh, a sheet in which conductive threads are knitted in a mesh form, and cloth coated with conductive material. Examples of the shielding film include film with an isolating layer and a conductive layer, film coated with metal, and film having mesh pattern printed on the surface thereof. The shielding 25 is disposed between the first substrate 21 and the second substrate 22. Specifically, the shielding 25 is disposed substantially in parallel to the first substrate 21 and the second substrate 22. The shielding 25 is apart from both the first substrate 21 and the second substrate 22. In other words, there is a gap between the shielding 25 and the first substrate 21. Similarly, there is a gap between the shielding 25 and the second substrate 22. The distance between the shielding 25 and the first substrate 21 may or may not be the same as the distance between the shielding 25 and the second substrate 22. Some spacers may be disposed between the shielding 25 and the first substrate 21, and between the shielding 25 and the second substrate 22 to maintain the gaps. As will be understood from the foregoing description, the shielding 25 functions as a shielding to reduce electrical interference between the components on the first substrate 21 and those on the second substrate 22.

The second embodiment realizes the same effect as that of the first embodiment. In light of the reduction of the area in the ground loop, it is preferable that the first substrate 21 and the second substrate 22 be sufficiently close to each other. However, in a case in which the first substrate 21 and the second substrate 22 are excessively close to each other, electrical interference may occur between the components on the first substrate 21 and those on the second substrate 22. In the second embodiment, the shielding 25 having conductivity is disposed between the first substrate 21 and the second substrate 22. Such a configuration enables electrical interference to be reduced between the components on the first substrate 21 and those on the second substrate 22, even if the first substrate 21 and the second substrate 22 are excessively close to each other. Furthermore, the shielding 25 is apart from the first substrate 21, and is apart from the second substrate 22. Such a configuration realizes easy removal and installation of the first substrate 21 and the second substrate 22 for maintenance, as compared with a case in which both are fixed to the shielding 25.

Third Embodiment

Figure 10:
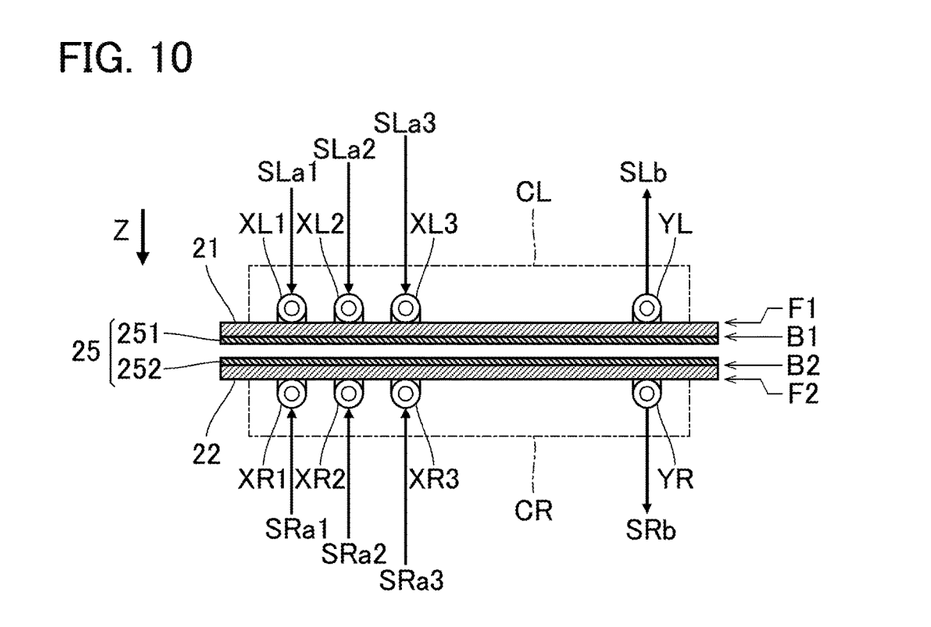
FIG. 10 is a plan view of a first substrate and a second substrate according to a third embodiment.

FIG. 10 is a side view of the first substrate 21 and the second substrate 22 according to the third embodiment. As shown in FIG. 10, the shielding 25 includes a first shielding member 251 and a second shielding member 252. The first shielding member 251 is a conductive member, and is on the opposite surface B1. Alternatively, the first substrate 21 may be a multiple-layer substrate in which conductive layers and insulating layers are laminated alternately. In this case, the outermost layer of the first substrate 21, that is, the closest conductive layer to the second substrate 22 from among the conductive layers of the first substrate 21, may serve as the first shielding member 251. Similarly, the second shielding member 252 is a conductive member and is on the opposite surface B2. Alternatively, the second substrate 22 may be a multiple-layer substrate in which conductive layers and insulating layers are laminated alternately. In this case, the outermost layer of the second substrate 22, that is, the closest conductive layer to the first substrate 21 from among the conductive layers of the second substrate 22, may serve as the second shielding member 252.

The third embodiment realizes the same effect as that of the first and the second embodiments. In the third embodiment, the first shielding 251 is on the opposite surface B1 of the first substrate 21, and the second shielding 252 is on the opposite surface B2 of the second substrate 22. In other words, the first shielding member 251 on the first substrate 21 and the second shielding member 252 on the second substrate 22 are apart from each other. Such a configuration enables electrical interference to be reduced between the components on the first substrate 21 and those on the second substrate 22 as compared with a case in which the shielding 25 is provided alone as shown in FIG. 9. This effect is especially notable.

Fourth Embodiment

Figure 11:
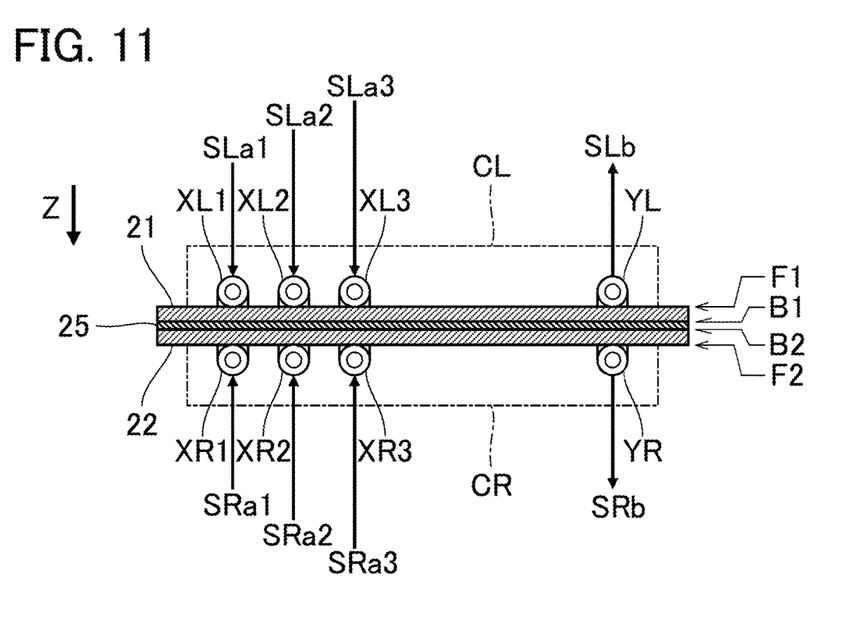
FIG. 11 is a plan view of a first substrate and a second substrate according to a fourth embodiment.

FIG. 11 is a side view of the first substrate 21 and the second substrate 22 according to the fourth embodiment. As shown in FIG. 11, in the fourth embodiment, the first substrate 21, the second substrate 22 and the shielding 25 are laminated integrally without gaps therebetween.

Specifically, the first substrate 21, the second substrate 22 and the shielding 25 are considered to be a multiple-layer substrate in which conductive layers and insulating layers are laminated alternately. In one example in FIG. 11, the first substrate 21, the shielding 25 and the second substrate 22 are laminated integrally in the listed order. For example, one conductive layer of the multiple-layer substrate may serve as the shielding 25. In this case, a layer on the negative side in the Z direction as viewed from the shielding member 25 corresponds to the first substrate 21, and a layer on the positive side in the Z direction as viewed from the shielding member 25 corresponds to the second substrate 22.

The fourth embodiment realizes the same effect as those of the first and the second embodiments. In the fourth embodiment, the first substrate 21, the second substrate 22 and the shielding 25 are laminated without gaps. Such a configuration enables effective reduction of the area in the ground loop (ideally, minimized). The above-described effect, that is, enabling the reduction of noise caused by the ground loop, is especially notable.

Modifications

Other aspects follow that may be added to each embodiment. Various modifications may be made to the embodiments described above. Specific modifications will be described below. Two or more modifications may be freely selected from the following and combined as appropriate so long as they do not conflict with each other.

(1) In each of the embodiments described above, the signal processing circuit CL includes the selection circuit QL and the amplifier AL. However, the configuration of the signal processing circuit CL is not limited thereto. For example, the selection circuit QL (and the input terminals XL2 and XL3 additionally) may be omitted. In this case, the left channel audio signal SLa from an external device may be input to the input terminal XL1, and in turn may be supplied to the amplifier AL directly. In addition, the signal processing circuit CL may include an audio processing circuit that imparts the specific frequency characteristics to the left channel audio signal SLa. Alternatively, the signal processing circuit CL may be a power circuit that generates a voltage for the signal processing circuit CL. Similarly, the signal processing circuit CR may include an audio processing circuit or a power circuit. The selection circuit QR (the input terminals XR2 and XR3 additionally) may be omitted. In this case, the right channel audio signal SRa from an external device may be input to the input terminal XR1, and in turn may be supplied to the amplifier AR directly.

(2) In each of the embodiments described above, the mounting surface F1 of the first substrate 21 is provided with components of the signal processing circuit CL. However, the opposite surface B1 of the first substrate 21 may be provided with some components of the signal processing circuit CL. Similarly, the opposite surface B2 of the second substrate 22 may be provided with a portion of components of the signal processing circuit CR. In the light of reduction of the area in the ground loop, it is preferable that mounting components with low height such as a chip capacitor be on the opposite surface B1 or B2, such that the first substrate 21 and the second substrate 22 are sufficiently close to each other.

In other words, when the opposite surface B1 is provided with a portion of mounting components of the signal processing circuit CL, it is preferable that the height of each mounting component on the opposite surface B1 be lower than that of the mounting surface F1. Similarly, when the opposite surface B2 is provided with a portion of mounting components of the signal processing circuit CR, it is preferable that the height of each mounting component on the opposite surface B2 be lower than that of the mounting surface F2.

(3) In each of the embodiments described above, the components on the mounting surface F1 of the first substrate 21 and those on the mounting surface B2 of the second substrate 22 are axially symmetric, but this relationship is not limited thereto. Specifically, the mounting components on the first substrate 21 and those on the second substrate 22 may be asymmetric in their positions. As will be understood from the foregoing description, in a configuration in which the first substrate 21 and the second substrate 22 face each other, if the mounting surface F1 of the first substrate 21 that is on the opposite side of the second substrate 22 is provided with components for the left channel, and the mounting surface F2 of the second substrate 22 that is on the opposite side of the first substrate 21 is provided with components for the right channel, the reduction of the area in the ground loop, as compared with those in the Comparative Examples 1 and 2, is realized. The reduction of the area in the ground loop leads to less noise.

(4) The following configurations are understood from the foregoing embodiments.

An amplifying device according to one aspect of the present invention (referred to as the "first aspect") includes a first substrate and a second substrate facing each other, and in which the first substrate has a first mounting surface, in which the first mounting surface of the first substrate that is on an opposite side of the second substrate is provided with: a first ground line; a first signal line configured to transfer a first audio signal; and in which the second substrate has a second mounting surface, in which the second mounting surface of the second substrate that is on an opposite side of the first substrate is provided with: a second grounded line; a second signal line configured to transfer a second audio signal; and a second amplifier configured to amplify the second audio signal, in which the first grounded line and the second grounded line correspond to each other in their positions and shapes, and overlap with each other in planar view, and in which the first signal line and the second signal line correspond to each other in their positions and shapes, and overlap with each other in planar view. In this aspect, the first mounting surface of the first substrate that is on the opposite side of the second substrate is provided with the first ground line, the first signal line and the first amplifier. The second mounting surface of the second substrate that is on the opposite side of the first substrate is provided with the second grounded line, the second signal line and second amplifier. The first grounded line and the second grounded line overlap in planar view. The first signal line and the second signal line overlap in planar view. Such a configuration enables the reduction of a ground loop including the first grounded line and the second grounded line. The reduction of the area surrounded by the ground loop leads to less noise.

In one preferable aspect (referred to as the "second aspect") according to the first aspect, the first amplifier overlaps with the second amplifier in planar view. In this aspect, the first amplifier overlaps with the second amplifier in planar view. The above-described effect, that is, enabling the reduction of noise caused by the ground loop, is especially notable.

In one preferable aspect (referred to as the "third aspect") according to the first aspect or the second aspect, the first mounting surface is provided with a first input terminal to which the first audio signal is input and a first output terminal to which the amplified signal by the first amplifier is output, in which the second mounting surface is provided with a second input terminal to which the second audio signal is input and a second output terminal to which an amplified signal by the second amplifier is output, in which the first input terminal overlaps with the second input terminal in planar view, and in which the first output terminal overlaps with the second output terminal in planar view. In this aspect, the first input terminal overlaps with the second input terminal in planar view. The first output terminal overlaps with the second output terminal in planar view. The above-described effect, that is, enabling the reduction of noise caused by the ground loop, is especially notable.

In one preferable aspect (referred to as the "fourth aspect") according to any one of the first aspect to the third aspect, components on the first mounting surface and those on the second mounting surface are axially symmetric with each other. In other words, components on the first mounting surface are symmetric to those on the second mounting surface with respect to an imaginary plane between the first substrate and the second substrate facing each other. In this aspect, the components on the first mounting surface and those on the second mounting surface are axially symmetric with each other. Such a configuration enables reduction of the area surrounded by the ground loop. The above-described effect, that is, enabling the reduction of noise caused by the ground loop, is especially notable.

The amplifying device according to one preferable aspect (referred to as the "fifth aspect") according to any one of the first aspect to the fourth aspect includes a conductive shielding between the first substrate and the second substrate. In this aspect, the conductive shielding is between the first substrate and the second substrate. Such a configuration enables electrical interference to be reduced between the components on the first substrate and those on the second substrate.

In one preferable aspect (referred to as the "sixth aspect") according to the fifth aspect, the conductive shielding includes: a first shielding member on an opposite side of the first mounting surface of the first substrate; and a second shielding member on an opposite side of the second mounting surface of the second substrate. In this aspect, the first shielding member is on the first substrate, and the second shielding member is on the second substrate. Such a configuration enables electrical interference to be reduced between the components on the first substrate and those on the second substrate. This effect is especially notable.

In one preferable aspect (referred to as the "seventh aspect") according to the fifth aspect, the conductive shielding is apart from both the first substrate and the second substrate. In this aspect, the conductive shielding is apart from both the first substrate and the second substrate. Such a configuration realizes easy removal and installation of the first substrate and the second substrate for maintenance, as compared with a case in which both are fixed to the conductive shielding.

In one preferable aspect (referred to as the "eighth aspect") according to the fifth aspect, the first substrate, the conductive shielding and the second substrate are laminated integrally. In this aspect, the first substrate, the conductive shielding and the second substrate are laminated integrally. The above-described effect, that is, enabling reduction of noise caused by the ground loop, is especially notable.

DESCRIPTION OF REFERENCE SIGNS

100 . . . amplifying device
10 . . . housing
21 . . . first substrate
22 . . . second substrate
XL1, XL2, XL3 (XL) . . . input terminal
XR1, XR2, XR3 (XR) . . . input terminal
YL, YR . . . output terminal
F1, F2 . . . mounting surface
B1, B2 . . . opposite surface
CL, CR . . . signal processing circuit
QL, QR . . . selection circuit
AL, AR . . . amplifier
GL, GR . . . grounded line
WLa, WLb . . . signal line
WRa, WRb . . . signal line
O . . . reference line
SLa1, SLa2, SLa3 (SLa), SLb . . . left channel audio signal
SRa1, SRa2, SRa3 (SRa), SRb . . . right channel audio signal
25 . . . shielding
251 . . . first shielding member
252 . . . second shielding member

What is claimed is:
1. An amplifying device comprising:
a first substrate and a second substrate facing each other, and
wherein the first substrate has a first mounting surface,
wherein the first mounting surface of the first substrate that is on an opposite side of the second substrate is provided with:
a first ground line;
a first signal line configured to transfer a first audio signal; and
a first amplifier configured to amplify the first audio signal,
wherein the second substrate has a second mounting surface, wherein the second mounting surface of the second substrate that is on an opposite side of the first substrate is provided with:
a second grounded line;
a second signal line configured to transfer a second audio signal; and
a second amplifier configured to amplify the second audio signal,
wherein the first grounded line and the second grounded line correspond to each other in their positions and shapes, and overlap with each other in planar view, and
wherein the first signal line and the second signal line correspond to each other in their positions and shapes, and overlap with each other in planar view.

2. The amplifying device according to claim 1,
wherein the first amplifier overlaps with the second amplifier in planar view.

3. The amplifying device according to claim 1,
wherein the first mounting surface is provided with a first input terminal to which the first audio signal is input and a first output terminal from which the amplified signal by the first amplifier is output,
wherein the second mounting surface is provided with a second input terminal to which the second audio signal is input and a second output terminal from which an amplified signal by the second amplifier is output,
wherein the first input terminal overlaps with the second input terminal in planar view, and
wherein the first output terminal overlaps with the second output terminal in planar view.

4. The amplifying device according to claim 1,
wherein components on the first mounting surface and those on the second mounting surface are axially symmetric with each other.

5. The amplifying device according to claim 1, further comprising:
a conductive shielding between the first substrate and the second substrate.

6. The amplifying device according to claim 5,
wherein the conductive shielding includes:
a first shielding member on an opposite side of the first mounting surface of the first substrate; and
a second shielding member on an opposite side of the second mounting surface of the second substrate.

7. The amplifying device according to claim 5,
wherein the conductive shielding is apart from both the first substrate and the second substrate.

8. The amplifying device according to claim 5,
wherein the first substrate, the conductive shielding and the second substrate are laminated integrally.

\* \* \* \* \*